United States Patent
Dorrestijn

(10) Patent No.: US 12,061,221 B2
(45) Date of Patent: Aug. 13, 2024

(54) ELECTRIC FIELD GRADIENT SENSOR

(71) Applicant: FNV IP B.V., Leidschendam (NL)

(72) Inventor: Igor Konrad Dorrestijn, Leidschendam (NL)

(73) Assignee: FNV IP B.V., Leidschendam (NL)

( * ) Notice: Subject to any disclaimer, the term of this patent is extended or adjusted under 35 U.S.C. 154(b) by 0 days.

(21) Appl. No.: 17/778,044

(22) PCT Filed: Nov. 26, 2020

(86) PCT No.: PCT/NL2020/050742
§ 371 (c)(1),
(2) Date: May 19, 2022

(87) PCT Pub. No.: WO2021/107776
PCT Pub. Date: Jun. 3, 2021

(65) Prior Publication Data
US 2022/0413027 A1    Dec. 29, 2022

(30) Foreign Application Priority Data

Nov. 27, 2019  (NL) ...................................... 2024318

(51) Int. Cl.
*G01R 29/12* (2006.01)
*G01N 17/02* (2006.01)
(Continued)

(52) U.S. Cl.
CPC ......... *G01R 29/0878* (2013.01); *G01N 17/02* (2013.01); *G01R 29/0807* (2013.01); *B63B 17/00* (2013.01)

(58) Field of Classification Search
CPC ................ G01N 17/02; G01R 29/0807; G01R 29/0878; G01R 29/085; G01R 29/0871;
(Continued)

(56) References Cited

U.S. PATENT DOCUMENTS

| 8,447,532 B1 | 5/2013 | Goroshevskiy et al. |
| 10,588,543 B2 * | 3/2020 | Bar-Tal ................ A61B 5/0538 |

(Continued)

FOREIGN PATENT DOCUMENTS

| CN | 108614163 A | 10/2018 |
| CN | 109298019 A | 2/2019 |

(Continued)

OTHER PUBLICATIONS

FIGS Generic Method Statement, FORCE Technology Norway AS, Doc No. 51159, version V2A, 2017.
FIGS Frequently Asked Questions; FORCE Technology Norway AS.

*Primary Examiner* — Thang X Le
(74) *Attorney, Agent, or Firm* — Polsinelli PC

(57) ABSTRACT

An electric field gradient sensor is presented, having a sensor body having an outer surface; and a plurality of electrodes distributed over the outer surface, each electrode having an electrode surface facing outward from the surface. The plurality of electrodes are arranged forming a plurality of electrode pairs, each electrode pair formed by a first electrode and a second electrode located on opposite sides of the sensor body. This sensor enables three-dimensional measurements of the electric field gradient along structures located in an electrically conductive medium, such as subsea structures, for example for monitoring the cathodic protection of such structure.

40 Claims, 4 Drawing Sheets

(51) Int. Cl.
 *G01R 29/08* (2006.01)
 *B63B 17/00* (2006.01)
(58) Field of Classification Search
 CPC .......... G01R 29/12; G01R 29/14; G01V 3/08;
 G01V 3/083; G01V 3/088; C23F 13/04;
 C23F 2213/31; C23F 2213/32; B63B
 17/00; B63B 59/00; F17D 5/00
 See application file for complete search history.

(56) References Cited

U.S. PATENT DOCUMENTS

| | | | | |
|---|---|---|---|---|
| 2009/0195255 | A1* | 8/2009 | Kalokitis | ........... G01R 29/0878 |
| | | | | 324/522 |
| 2010/0185348 | A1 | 7/2010 | Webb | |
| 2011/0252890 | A1* | 10/2011 | Matsuda | ................ G01N 29/24 |
| | | | | 73/632 |
| 2012/0199755 | A1* | 8/2012 | Generazio | ................. G01T 1/00 |
| | | | | 250/336.1 |
| 2014/0077822 | A1* | 3/2014 | Leuthold | ................ G01B 7/023 |
| | | | | 324/609 |
| 2015/0369949 | A1* | 12/2015 | Cuevas | .................... G01V 3/26 |
| | | | | 324/338 |
| 2016/0238645 | A1* | 8/2016 | Baicry | ................... G01R 29/08 |
| 2016/0238646 | A1* | 8/2016 | Baicry | .............. G01R 29/0878 |
| 2018/0216978 | A1* | 8/2018 | Dames | .................... G01F 15/18 |
| 2020/0025966 | A1* | 1/2020 | Ramanathan | .......... G01V 3/088 |

FOREIGN PATENT DOCUMENTS

| | | | |
|---|---|---|---|
| EP | 3163288 | A2 | 5/2017 |
| JP | 2000304533 | * | 11/2000 |
| JP | 2000304533 | A | 11/2000 |
| WO | 2009067015 | A1 | 5/2009 |
| WO | 2015177499 | A1 | 11/2015 |
| WO | 2017126975 | A1 | 7/2017 |

* cited by examiner

ELECTRIC FIELD GRADIENT SENSOR

FIELD OF THE INVENTION

The present invention relates to an electric field gradient sensor for measuring the electric field around and/or along a structure located in an electrically conducting medium. The electric field gradient sensor is in particular useful for assessing the state of cathodic protection of pipelines, marine and/or subsea structures.

BACKGROUND ART

Structures, such as pipelines, marine structures, etc., located under water, e.g. in sea, are often provided with cathodic protection for preventing corrosion of the structure. However, the cathodic protection may become damaged or degrade with time, or be otherwise defective. Therefore, there exists a need to assess and/or monitor the status of the cathodic protection.

Measurements of the status of cathodic protection have conventionally been performed by contact measurements using a stab or probe stepped over the structure. This is however a rather time consuming procedure.

Faster measurements can be achieved by sensors configured for performing non-contact measurements while being moved along the structure.

WO 2017/126975 A1 presents a method and a sensor for detection of electric fields around a structure in an electrically conducting medium while moving the sensor along the structure. This sensor comprises two electrodes located on a rotating disc, enabling measuring the electrical field in the rotation plane of the disc. For measuring the electric field in three dimensions two sensors are required, arranged at a 90° angle to one another. This leads to a complex instrument, relying on rotating parts and having complex electronics inside. The instrument further has a relatively large weight, which has to be taken into account when using the sensor.

SUMMARY OF THE INVENTION

It is an object of the invention to provide an electric field gradient sensor having a less complex construction. Also, it is an object of the present invention to provide a sensor that is more suitable for subsea use wherein high pressures and being immersed in an electrically-conductive liquid is a challenge.

In particular, it is an object of the invention to provide an electric field gradient sensor enabling three-dimensional measurements of the electric field gradient along a structure.

This is achieved by an electric field gradient sensor as defined in claim 1.

Embodiments of the invention are claimed in dependent claims.

In a first aspect an electric field gradient sensor is provided, comprising:
a sensor body having an outer surface; and
a plurality of electrodes distributed over said surface, each electrode having an electrode surface facing outward from said surface;
wherein said plurality of electrodes are arranged forming a plurality of electrode pairs, each electrode pair comprising a first electrode and a second electrode located on opposite sides of said sensor body.

By measuring the differential voltage between the first and the second electrode of each electrode pair, an electric field vector can be calculated. By the arrangement of the plurality of electrode pairs a three-dimensional measurement of the electric field can be obtained. By sampling the differential voltages while moving the sensor along and/or around at least a portion of a structure, a three-dimensional map of the electric field gradient can be obtained, in a relatively fast manner.

This sensor is of a simple and light weight construction, and can be manufactured at low cost, as will be apparent further below. As moving parts are avoided, a sensor is achieved having low complexity, while enabling three-dimensional measurement of the electric field.

The electrodes are preferably arranged with their surfaces arranged flush with the outer surface of the sensor body.

For each electrode pair an interconnecting line can be formed, interconnecting the first electrode and the second electrode. The electrodes are preferably distributed over said surface such that said interconnecting lines intersect at one single point of intersection. This point of intersection forms a reference point for the differential voltages measured across each electrode pair. By all electrode pairs having a common reference point, the calculation of the electric field gradient from the measured differential voltages can be simplified.

The single point of intersection may substantially correspond to a geometrical center of said sensor body. This also contributes to avoiding unnecessarily complex calculations.

The shape and the size of the sensor body can be selected in accordance with, e.g., the intended use of the sensor. For example, the size and/or the shape can be selected based on the location and/or structure which will be assessed using the sensor, and/or the specifics of the vehicle, such as an ROV or AUV, with which the sensor will be used.

The sensor body may have a substantially spherical shape. This provides easy manufacturing and enables, by the distribution of the electrodes over the outer surface, measuring the electric field in three dimensions. A spherical shape of the sensor body may have the advantage of less complex calculations of the electrical field from the differential voltages measured over each electrode pair.

Alternatively, the sensor body may have an oblate spheroid shape or a prolate spheroid shape.

Alternatively, the sensor body may have a substantially cylindrical shape. In this embodiment, the electrodes are distributed over the curved cylinder surface. The electrodes, provided on the curved surface, are further preferably distributed over the length of the cylinder, having a plurality of electrodes along the length of the cylinder. A cylindrically shaped sensor body may be advantageous for use with small AUVs (autonomous underwater vehicles), which may be configured for the mounting of cylindrical payload modules thereto.

The sensor preferably further comprises sensor electronics arranged within the sensor body for measuring a voltage over each of the electrode pairs. Alternatively, the sensor electronics may be arranged in an unmanned underwater vehicle to which the sensor is mounted during use, the sensor electronics being connected to the electrodes via electrical connectors extending from the electrodes, through the interior of the sensor body and to the sensor electronics in the vehicle via mounting means via which the sensor is mounted to the vehicle.

The sensor electronics is preferably pressure tolerant or pressure resistant. This can be achieved, for example, by potting the electronics. Thereby, a pressure housing is not required, whereby the weight of the sensor can be reduced.

The voltage difference measured over an electrode pair may be represented by a vector, indicating the value and/or magnitude of the differential voltage measured over the first and the second electrode, and having a direction defined by the line of intersection between the first and second electrode. The resulting electric field vector at a measurement, or sampling, location is obtained by combining the vectors achieved from each electrode pair. An electric field vector at the measurement or sampling point can be calculated by combining the vectors associated by the individual electrode pairs by vector addition or by a more complex equation, depending e.g. on the geometry of the sensor body and the locations and/or the distribution of the electrodes. By performing measurements at a plurality of measurement, or sampling, points around or along at least a part of the structure, the electric field gradient around or along the structure can be calculated. From the electric field gradient, the status of the cathode protection of the structure can be determined, whereby a defective or degraded cathode protection can be detected.

The sensor electronics preferably comprises electrical contacts to each of the plurality of electrodes and a microcontroller for sampling a differential voltage over each electrode pair.

The sensor electronics preferably further comprises one or more of the following: amplifiers for amplifying measured voltages, a power source, and a communication unit for communicating said measured voltages to a receiver arranged remote from the sensor.

The sensor electronics is hence relatively simple, and allows fast interrogation of the differential voltages over the plurality of electrode pairs.

The sensor preferably further comprises a bias electrode arranged for setting a bias voltage for the sensor electronics. The bias electrode may advantageously be arranged at the point of intersection of the lines interconnecting the electrodes of the electrode pairs. Alternatively, the bias electrode may be arranged outside of said sensor body, for example at a center location in front of or on the sensor body.

The sensor body preferably comprises a non-conductive plastic or composite material. This enables easy manufacturing and low cost, as well as a light weight sensor. In preferred embodiments, as will be described below, the sensor body may be manufactured by 3D printing, in particular if the sensor body is of spherical or spheroidal shape. The non-conductive plastic material may comprise, for example, a reinforced epoxy material. Other alternatives may include composite glass.

The electrode surfaces may comprise gold, carbon, platinum, titanium or stainless steel. These materials have been seen to function well while being immersed in a conductive fluid, such as e.g. (sea) water. These materials are further easy to apply during manufacturing, and at least gold, carbon, platinum and titanium require little maintenance.

In preferred embodiments, the electrodes may be formed by gold plated circuit boards. This offers easy and cost-effective manufacturing. Alternatively, the electrodes may be formed from metal plated with gold or platinum.

In some embodiments, each electrode may be provided with an electrically non-conductive tube, a first end of said tube enclosing said electrode. The tubes extend outwards from the sensor body, preferably in a substantially radial direction.

That is, the sensor may be provided with a plurality of hollow non-conductive tubes, or sleeves, extending radially outwards from the sensor body. The tubes are attached, or sealed, to the sensor body such that each electrode is located within a first end of the tube, i.e., enclosed by a tube. By adding such non-conductive tubes to the sensor, the effective distance between the electrodes of each electrode pair is increased, increasing the differential voltage measured over the electrode pair. Thereby, the sensitivity of the sensor can be increased.

The non-conductive material may be, for example, a plastic material or a flexible polymer or rubber. This material is preferably chosen such that the tubes have a flexibility such as to be deformed without damage if colliding when an object. At the same time, the tubes should be rigid enough not to deform under normal use, i.e., when travelling or being moved through the electrically conductive medium, such as seawater, without colliding with an object during measurement.

The number of electrodes may be selected as a balance between measurement accuracy and the cost and complexity of manufacturing the sensor. The sensor typically comprises between 6 to 40 electrodes, preferably between 20 to 34, more preferably 24 or 32 electrodes. Thus, at least three electrode pairs should be provided in order to enable measuring the electric field in three dimensions. Providing 12 electrode pairs on the sensor body may provide measurement results of higher accuracy, while still offering a fast measurement.

The sensor body may be hollow and provided with a plurality of holes in its outer surface. Thereby, the liquid or fluid, such as water, through which the sensor is moved can be allowed to enter the sensor body. If the bias electrode is arranged within the sensor body, the liquid or fluid can thereby come into contact with the bias electrode, for setting a bias voltage.

The sensor further preferably comprises a mounting component, such as a mounting pole, coupled to said sensor body for mounting said sensor to a vehicle, in particular to an unmanned underwater vehicle. Such unmanned underwater vehicle will typically be an ROV (remotely operated vehicle) or an AUV (autonomous underwater vehicle), which are known in the art. The mounting pole is preferably made of a non-conductive composite material or a plastic material.

The mounting pole generally has a length sufficient to position the sensor at such a distance from the vehicle such that any disturbances from the vehicle and any electronics and/or other equipment or components arranged thereon or therein are minimized, at least such as to be negligible. Such distance typically amounts to between 0.5 to 1.5 meters, preferably about 1 meter.

The sensor is preferably fixed with respect to the vehicle during measurements. Thereby, moving parts are avoided, leading to a sensor having low complexity.

In a second aspect, a system for measuring an electric field gradient at a structure located in an electrically conductive medium is provided, the system comprising an electric field gradient sensor according to the first aspect mounted to said unmanned underwater vehicle.

In a third aspect, a method for manufacturing an electric field gradient sensor is provided, comprising the steps of:
  providing sensor electronics;
  forming a sensor body around said sensor electronics, said sensor body having an outer surface; and
  forming a plurality of electrodes distributed over said surface, each electrode having an electrode surface facing outward from said surface and being electrically connected to said sensor electronics;
wherein said plurality of electrodes are arranged such as to form a plurality of electrode pairs, each electrode pair comprising a first electrode and a second electrode located on opposite sides of said sensor body.

In particular, the sensor according to the first aspect may be manufactured by the method according to the third aspect. The various embodiments and associated technical effects and advantages described above with reference to the first aspect apply analogously and/or correspondingly to the method of the third aspect.

The sensor body may preferably be made, at least partially, from a plastic and/or composite material. This provides a light weight sensor. The sensor electronics may be potted inside the sensor body.

The sensor body is advantageously formed by 3D printing. That is, the sensor body may be 3D printed around the sensor electronics. This offers an easy and cost effective way of manufacturing the sensor. Furthermore, the sensor body can be formed in accordance with the intended use.

Alternatively, the sensor body may be formed by molding or machining, i.e., molding a plastic material around the sensor electronics.

The step of forming the plurality of electrodes preferably comprises providing electrodes having the outward facing electrode surface comprising gold, carbon, platinum, titanium or stainless steel.

The electrode surface may be formed by plating gold or platinum onto a metal.

The step of forming the plurality of electrodes may comprise plating circuit boards with gold. Alternatively and/or additionally, the electrodes may be formed by printing carbon onto gold plated circuit boards.

As described above, the sensor may be provided with non-conductive tubes enclosing each electrode and extending radially from the sensor body.

In a fourth aspect, a method is provided of performing electric field gradient measurements of a structure located in an electrically conducting medium, comprising the steps of:
 providing an electric field gradient sensor according to the first aspect;
 mounting said sensor to an unmanned underwater vehicle; and
 moving said vehicle along at least a part of said structure, while sampling differential voltages over said electrode pairs of said sensor at a plurality of sampling locations.

This method enables a time- and cost-effective measurement of the electric field gradient in the vicinity of the structure, enabling a three-dimensional measurement of the electric field gradient while flying over and/or moving the sensor along at least a part of the structure. This enables a relatively quick manner of e.g. assessing the cathodic protection of the structure.

Structures include for example flowlines, pipelines and jackets arranged in an electrically conducting medium, for example water, e.g. sea water, and other subsea structures. Other locations and/or other types of electrically conductive media are also possible.

The method, and the sensor, enables measurement of anode current of a cathodic protection installation, current densities, current drain to other structures, as well as well as detection of defects in a coating on the structure.

The electric field gradient sensor may be a sensor according to any one or more of the embodiments of the sensor of the first aspect described above. As described above, the vehicle may be any unmanned vehicle such as commercially available ROV or AUV.

The sensor is preferably maintained substantially fixed with respect to said vehicle. Since no moving parts are involved in the sensor, a less complex system is achieved.

The differential voltages can be combined to form an electric field gradient vector at each of said plurality of sampling locations.

The method preferably further comprises registering the position of each sampling location. Thereby, the measurement results can be correlated with the location at which they were obtained, e.g. such as to correlate them with the geometry of the structure.

A processor including a computer program for processing the measurement results in order to calculate the electric field gradient at the sampling locations, and storing it, preferably together with the sampling location, may be provided on the vehicle or at a remote location.

BRIEF DESCRIPTION OF THE DRAWINGS

Further features and advantages of the invention will become apparent from the description of the invention by way of non-limiting and non-exclusive embodiments. These embodiments are not to be construed as limiting the scope of protection. The person skilled in the art will realize that other alternatives and equivalent embodiments of the invention can be conceived and reduced to practice without departing from the scope of the present invention. It can further be noted that the drawings are not necessarily drawn to scale.

Embodiments of the invention will be described with reference to the figures of the accompanying drawings, in which like or same reference symbols denote like, same or corresponding parts, and in which.

DESCRIPTION OF EMBODIMENTS

Figure 1A:
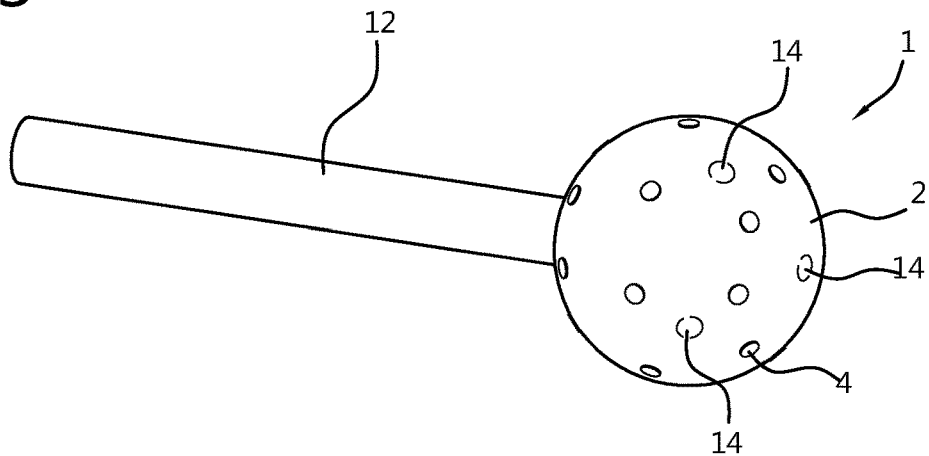
FIG. 1a shows a perspective view of an electric field gradient sensor according to an embodiment.

FIG. 1a shows a non-limiting embodiment of an electric field gradient sensor according to an embodiment of the invention. The sensor 1 comprises a sensor body 2 provided with a plurality of electrodes 4 on its outer surface. The electrodes 4 are arranged to form electrode pairs, each electrode pair being formed by oppositely located electrodes. The surfaces of the electrodes 4 contact the conductive medium, e.g. water, in which the sensor is immersed when performing measurements.

By measuring the voltage difference over each electrode pair, an electric field vector can be calculated, as has been described in detail in the Summary of invention herein above. By the distribution of the electrode pairs over the surface of the sensor body, the electric field gradient in the vicinity of a structure can be measured in three dimensions while moving the sensor along and/or around the structure.

The first electrode and the second electrode of the electrode pair are located on opposite sides of the sensor body 2, such that the electrode surfaces face in substantially opposite directions.

In the embodiment shown in FIG. 1a, the electrodes 4 are advantageously arranged such that lines interconnecting oppositely located electrodes intersect at a single point within the sensor body 2. This concept is described herein below with reference to FIG. 1b.

Figure 4:
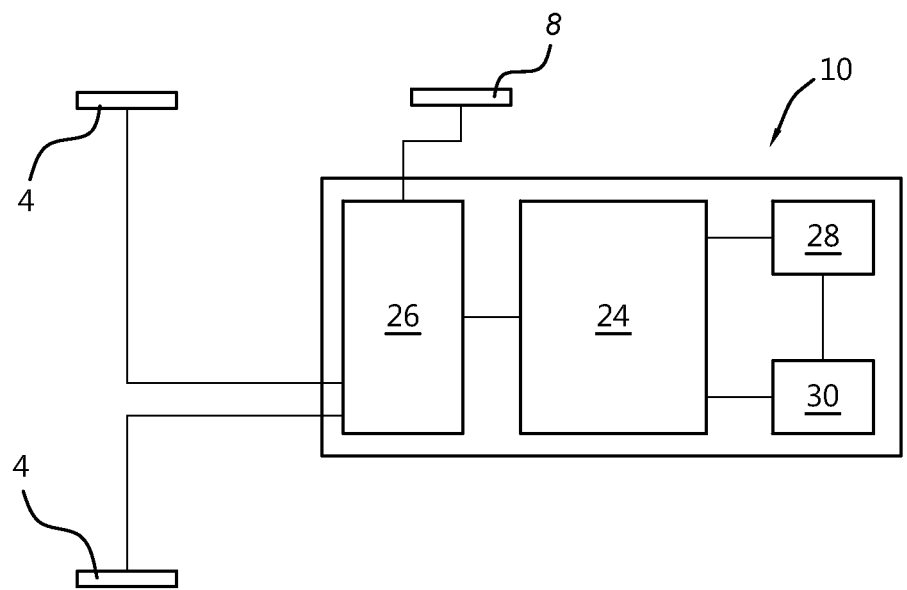
FIG. 4 schematically illustrates an electronic scheme of the sensor according to an embodiment.

Further, in the embodiment of FIG. 1a, sensor electronics 10 are provided inside the sensor body 2. An example of such sensor electronics 10 is illustrated in FIG. 4. Alternatively, the sensor electronics 10 may be provided in the unmanned underwater vehicle, and connected to the electrodes 4 via electrical connectors.

Figure 3:
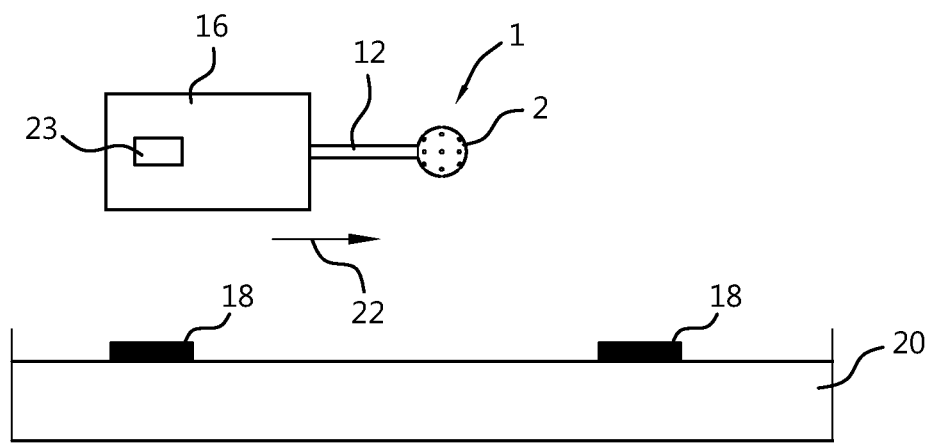
FIG. 3 schematically illustrates the electric field gradient sensor in use for measuring cathodic protection of a structure according to an embodiment.

The sensor 1 is further provided with a mounting pole 12, coupled to the sensor body 2 for mounting the sensor to an unmanned underwater vehicle, as shown in FIG. 3.

The electrodes 4 preferably arranged with their surfaces flush with the outer surface of the sensor body 2, their surfaces in contact with the medium, e.g. water, in which the measurements are performed.

The sensor body 2 may be hollow, and provided with holes 14. Thereby, the fluid, generally water, in which the sensor is immersed may come into direct contact with the bias electrode 8 located within the sensor body 2.

Figure 1B:
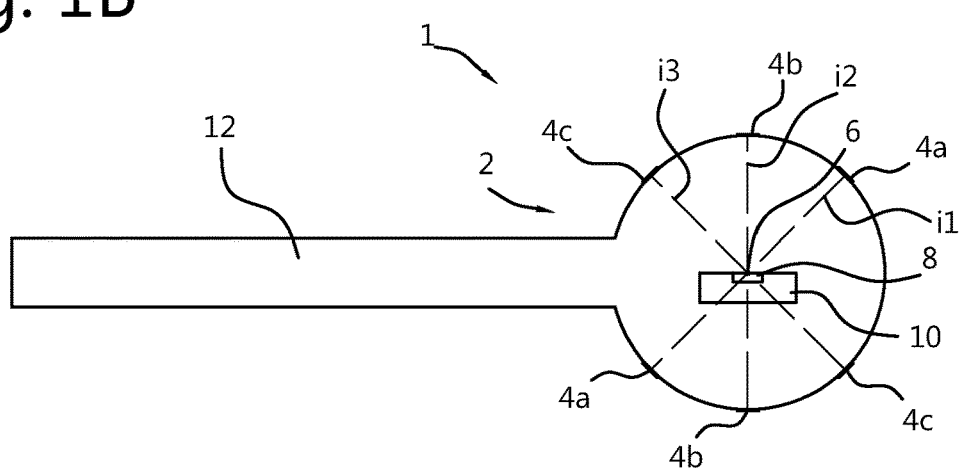
FIG. 1b schematically illustrates the relative position of the electrodes of a sensor as shown in FIG. 1a according to an embodiment.

FIG. 1b provides a simplified schematic illustration of three electrode pairs 4a, 4b, 4c. Each electrode pair comprises two electrodes, located on opposite sides of the sensor body 2 and interconnected by imaginary interconnection lines i1, i2, i3. In the embodiment of FIG. 1b, these interconnection lines i1, i2, i3 have a common, single intersection point 6. This point 6 forms a common reference point for the electrode pairs. As also illustrated in the embodiment of FIG. 1b, the intersection point 6 is advantageously located at the center of the spherical body 2.

It should be noted that the illustration of FIG. 1b provides a simplified illustration, for illustrating the interconnecting lines of the electrodes of each electrode pair having a common point of intersection. While in FIG. 1b the electrodes appear located in one single plane, in preferred embodiments, the electrodes will be distributed over the surface of the sensor body, as illustrated in FIG. 1a. Furthermore, in FIG. 1b three electrode pairs are illustrated, which may be sufficient in some embodiments. However, preferably more electrode pairs are provided, as also illustrated in FIG. 1a. As described above, providing 12 electrode pairs on the sensor provides a good balance between manufacturing cost and measurement accuracy.

The sensor preferably further comprises a bias electrode 8, which in the embodiment illustrated in FIG. 1b is arranged at the point of intersection 6. The bias electrode 8 is electrically connected to the sensor electronics 10, arranged within the sensor body 2.

Figure 1C:
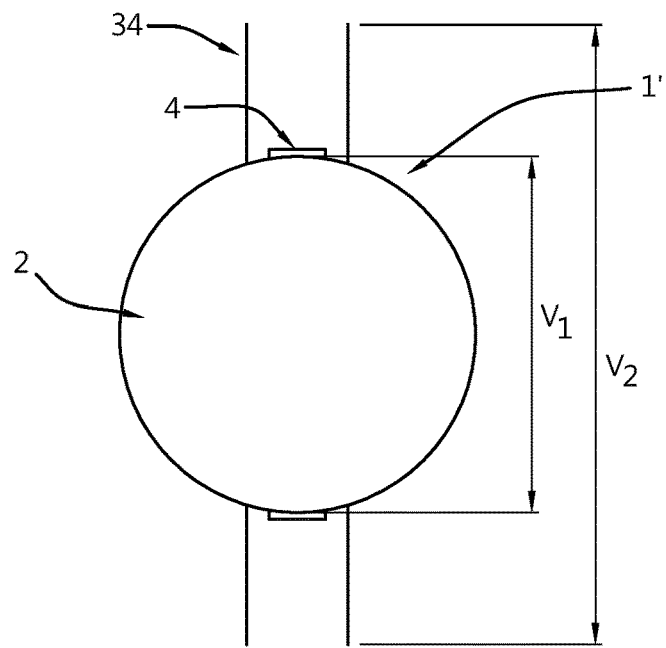
FIGS. 1c and 1d schematically illustrate a sensor according to a further embodiment being a further development of the sensor shown in FIGS. 1a and 1b.
Figure 1D:
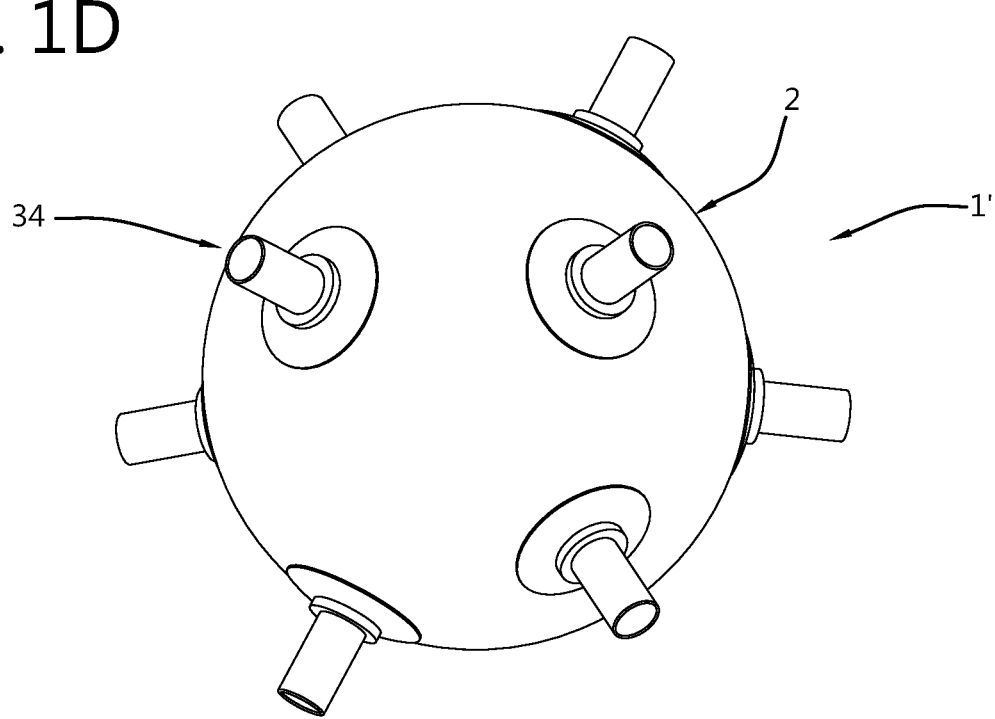

FIGS. 1c and 1d schematically shows a sensor 1' according to a further development of the sensor 1 shown in FIGS. 1a and 1b. According to this embodiment, the sensor is provided with a plurality of electrically non-conductive tubes 34, attached, e.g. sealed, around each electrode 4 and extending substantially radially outwards from the sensor body 2. The concept is illustrated in FIG. 1c, for one electrode pair. It should be understood that a tube 34 is provided at each electrode 4, as shown in FIG. 1d.

By providing the tubes 34, the effective distance between the electrodes 4, influencing the differential voltage, or potential, measured across the electrodes 4 forming an electrode pair, is increased. During use, as the sensor is moved through a medium, typically seawater, in the presence of an electric field, the differential voltage between the electrodes of each electrode pair is measured. From this differential voltage, as described further herein below, a measure of the electric field gradient in the vicinity of a structure, whose cathodic protection is to be monitored or assessed, is determined. In the absence of the tubes, a voltage V1 is measured, having a value correspond to the electric field multiplied by the distance between the electrodes 4, which corresponds to the diameter of the sensor body 2. However, in the presence of the non-conductive tubes 34, the differential voltage V2 is measured, corresponding to the voltage difference between the locations of the outer ends of the tubes 34. Thereby, the size of the sensor body 2 is artificially extended, increasing the value of the differential voltage measured and hence the sensitivity of the sensor 1. Due to the flexibility of the tubes 34, these will deform if the sensor body collides with an object during its movement around the structure to be assessed. Thereby, the passage of the sensor through a narrower passage will not be obstructed.

The concept illustrated in FIGS. 1c and 1d can be applied analogously to the embodiment of FIGS. 2a and 2b described herein below.

Figure 2A:
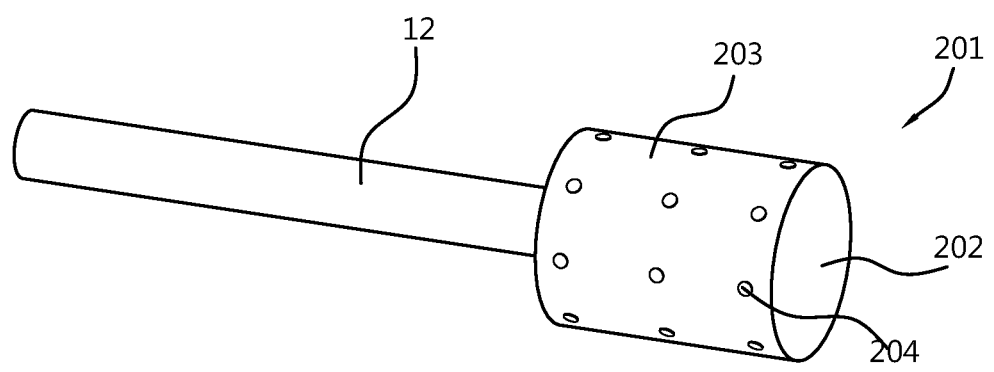
FIG. 2a shows a perspective view of an electric field gradient sensor according to another embodiment.
Figure 2B:
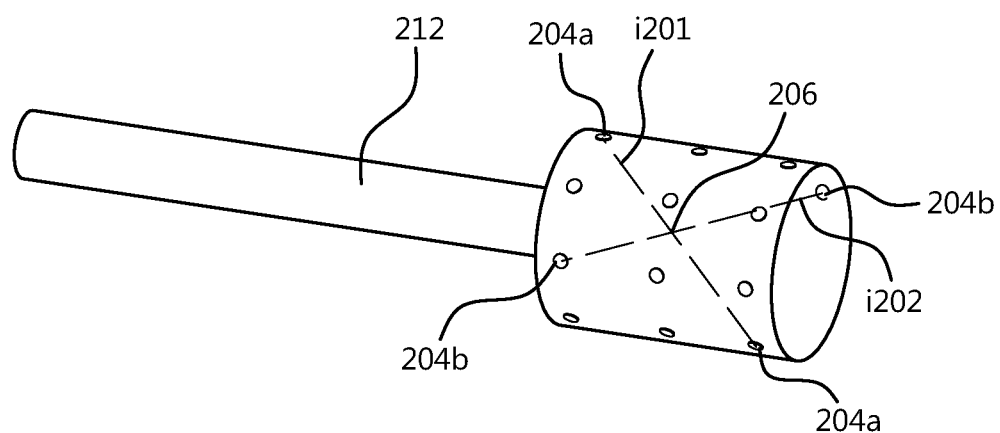
FIG. 2b schematically illustrates the relative position of the electrodes of a sensor as shown in FIG. 2a according to an embodiment.

FIGS. 2a and 2b show an electric field gradient sensor 201 according to a second embodiment of the invention. The sensor 201 comprises a sensor body 202 having a cylindrical shape, where the plurality of electrodes 204 are arranged on the curved surface 203 of the cylindrical sensor body 202, and distributed over the length of the cylinder. Except for this, the features of the sensor 201 and the function thereof correspond to those described with reference to FIG. 1a.

As schematically illustrated in FIG. 2b, the electrodes 204 may advantageously be arranged such that interconnection lines i201, i202 of electrodes making up electrode pairs 204a, 20ab intersect at an intersection point 206. Although in FIG. 2b, for ease of illustration, only two such interconnection lines i201, i202 are shown, it should be understood that this would apply for all electrode pairs of the sensor 201.

Figure 2C:
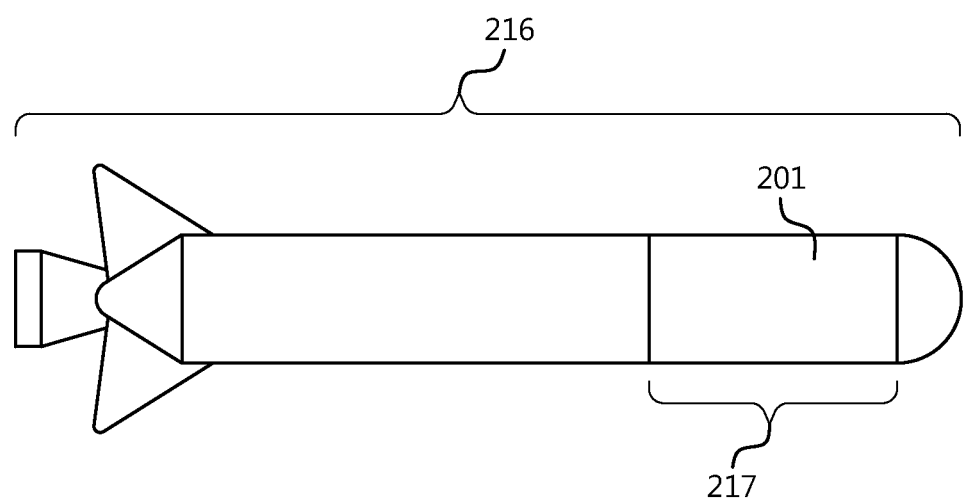
FIG. 2c schematically illustrates a sensor as shown in FIG. 2a mounted to an unmanned underwater vehicle according to an embodiment.

As mentioned above, a cylindrically shaped sensor has the advantage that it may be mounted to an ROV or AUV as a cylindrical payload section. FIG. 2c illustrates an unmanned underwater vehicle 216 having a cylindrical electric field gradient sensor 201 mounted thereto in the payload region 217.

FIG. 3 shows the electric field gradient sensor 1 mounted to an unmanned underwater vehicle 16 for assessing the state of a cathodic protection, here provided in the form of anodes 18, of a pipeline 20. As the sensor 1 is moved along the pipeline 20, or at least a part thereof, in a direction 22, the differential voltages over the electrode pairs, formed by the electrodes 4, are sampled at regular and/or preset intervals or locations.

The vehicle 16 will typically be an ROV (remotely operated vehicle) or an AUV (autonomous underwater vehicle), which are known in the field.

As illustrated in FIG. 3, the sensor 1 may be mounted in front of the vehicle 16 via the mounting pole 12. The sensor is mounted at such a distance to the vehicle that the vehicle, and instruments provided thereon or therein, do not disturb the measurements performed by the sensor. Such distance may for example be about 1 meter.

The sensor 1 is fixed with respect to the vehicle 16 during measurements. That is, no parts of the sensor are rotating or otherwise moving with respect to the vehicle as the vehicle is moved along the pipeline 20 while performing measurements of the electric field gradient along the pipeline 20.

Although in FIG. 3 the structure whose cathodic protection is to be assessed or monitored is illustrated as a pipeline, the method can be applied analogously to any other structure, such as a marine or a subsea structure.

By registering the measured differential voltages, and/or the calculated resulting electric field gradient, obtained at each sampling point, together with the location of the sampling point, a three-dimensional representation of the electric field gradient along and/or around the pipeline 20 can be obtained. The registration of the measurement results associated with the sampling locations can be performed by a processing unit 23 mounted to the vehicle 16. Alternatively, the processing unit may be located at a location remote from the vehicle 16 and sensor 1, e.g. at an on-shore location from which the vehicle 16 and sensor 1 are deployed.

FIG. 4 schematically shows an embodiment of the electronics scheme of the electric field gradient sensor. This can be applied to the sensor according to the embodiments of FIGS. 1a, 1b and of FIGS. 2a, 2b.

According to the embodiment illustrated in FIG. 4, the sensor electronics 10, which is arranged within the sensor body 2, 202, comprises a microprocessor 24 and amplifiers 26, which are electrically connected to the electrodes 4 (or 204) and the bias electrode 8 via electrical wiring. Thereby, the microprocessor can perform sampling of the differential voltage over each electrode pair, at regular and/or pre-set intervals, as described above. The microprocessor preferably comprises a clock unit for time-stamping the sampling results. The sensor electronics 10 further comprises a communication unit 28 for transmitting the sampling results to a receiver located remote from the sensor, for example on the ROV or AUV to which the sensor is mounted, or to more remote location, such as an operator control location. As described above, the sampling results may be combined with information defining the sampling locations, for example in the form of signals from a navigation unit, such as an inertial navigation system, INS, or an ultra-short baseline, USBL, system, located on board the ROV or AUV. Alternatively, the sampling locations can be determined via the time stamps associated with the sampling results. The sensor electronics further comprises a power unit 30, such as a battery, for providing power to the components of the sensor electronics.

It should be understood that further components may be added to the sensor electronics, as will be understood by the person skilled in the art.

The bias electrode 8, electrically coupled to the sensor electronics 10, can be located within the sensor body 2, 202, for example at the center of it, as described above. Alternatively, the bias electrode 8 may be located on the outer surface of the sensor body, for example at the front center point thereof.

It will be clear to a person skilled in the art that the scope of the invention is not limited to the examples discussed in the foregoing, but that several amendments and modifications thereof are possible without deviating from the scope of the invention as defined in the attached claims. While the invention has been illustrated and described in detail in the figures and the description, such illustration and description are to be considered illustrative or exemplary only, and not restrictive. The present invention is not limited to the disclosed embodiments but comprises any combination of the disclosed embodiments that can come to an advantage.

Variations to the disclosed embodiments can be understood and effected by a person skilled in the art in practicing the claimed invention, from a study of the figures, the description and the attached claims. In the description and claims, the word "comprising" does not exclude other elements, and the indefinite article "a" or "an" does not exclude a plurality. In fact it is to be construed as meaning "at least one". The mere fact that certain features are recited in mutually different dependent claims does not indicate that a combination of these features cannot be used to advantage. Any reference signs in the claims should not be construed as limiting the scope of the invention. Features of the above described embodiments and aspects can be combined unless their combining results in evident technical conflicts.

The invention claimed is:

1. An electric field gradient sensor, comprising:
a sensor body having an outer surface, wherein the outer surface is submerged in a fluid;
a plurality of electrodes distributed over the outer surface, each electrode having an electrode surface facing outward from the outer surface, wherein the plurality of electrodes are arranged forming a plurality of electrode pairs, each electrode pair comprising a first electrode and a second electrode located on opposite sides of the sensor body;
sensor electronics for measuring a voltage over each of the electrode pairs, the sensor electronics comprising electrical contacts to each of the plurality of electrodes; and
a bias electrode arranged for setting a bias voltage for the sensor electronics,
wherein for each electrode pair an imaginary interconnecting line is formed interconnecting the first electrode and the second electrode, and
wherein the electrodes are distributed over the outer surface such that the interconnecting lines intersect at a single point of intersection within the sensor body, and
wherein each electrode is provided with a non-conductive tube, a first end of the tube enclosing the electrode, wherein the bias electrode is arranged at the single point of intersection.

2. The sensor according to claim 1, wherein the non-conductive tubes extend in a substantially radial direction outwards from the sensor body.

3. The sensor according to claim 1, wherein the non-conductive tubes comprises a plastic material, a flexible polymer or rubber.

4. The sensor according to claim 1, wherein the single point of intersection substantially corresponds to a geometrical center of the sensor body.

5. The sensor according to claim 1, wherein the sensor body has a substantially spherical shape.

6. The sensor according to claim 1, wherein the sensor body has an oblate spheroid shape or a prolate spheroid shape.

7. The sensor according to claim 1, wherein the sensor body has a substantially cylindrical shape.

8. The sensor according to claim 1, wherein the sensor electronics is arranged within the sensor body or at a vehicle to which the sensor is mounted.

9. The sensor according to claim 1, wherein the sensor electronics further comprises a microcontroller for sampling a differential voltage over each electrode pair.

10. The sensor according to claim 9, wherein the sensor electronics further comprises one or more of the following: amplifiers for amplifying measured voltages, a power source, and a communication unit for communicating the measured voltages to a receiver arranged remote from the sensor.

11. The sensor according to claim 1, wherein the bias electrode is arranged outside of the sensor body.

12. The sensor according to claim 1, wherein the sensor body comprises a plastic material and/or a composite material.

13. The sensor according to claim 12, wherein the electrodes are formed by gold plated circuit boards, gold plated circuit boards printed with carbon; or by metal plated with gold or platinum.

14. The sensor according to claim 1, wherein the electrode surfaces comprise gold, carbon, platinum, titanium or stainless steel.

15. The sensor according to claim 1, wherein the plurality of electrodes comprises between 6 to 40 electrodes.

16. The sensor according to claim 1, further comprising a mounting component coupled to the sensor body for mounting the sensor to a vehicle.

17. The sensor according to claim 16, wherein the vehicle is an unmanned underwater vehicle.

18. The sensor according to claim 1, wherein the sensor body is hollow and is provided with a plurality of holes in its outer surface.

19. A system for measuring an electric field gradient at a structure located in an electrically conductive medium, the system comprising:
an electric field gradient sensor comprising a sensor body having an outer surface and a plurality of electrodes distributed over the outer surface, each electrode having an electrode surface facing outward from the outer surface, wherein the outer surface is submerged in a fluid and wherein the plurality of electrodes are arranged forming a plurality of electrode pairs, each electrode pair comprising a first electrode and a second electrode located on opposite sides of the sensor body;
an unmanned underwater vehicle, wherein the electrical field gradient sensor is mounted to the unmanned underwater vehicle;
sensor electronics for measuring a voltage over each of the electrode pairs, the sensor electronics comprising electrical contacts to each of the plurality of electrodes; and
a bias electrode arranged for setting a bias voltage for the sensor electronics,
wherein for each electrode pair an imaginary interconnecting line is formed interconnecting the first electrode and the second electrode,
wherein the electrodes are distributed over the outer surface such that the interconnecting lines intersect at a single point of intersection within the sensor body, and
wherein each electrode is provided with a non-conductive tube, a first end of the tube enclosing the electrode, wherein the bias electrode is arranged at the single point of intersection.

20. The system according to claim 19, wherein the sensor electronics is arranged within the sensor body or in the vehicle.

21. The system according to claim 20, wherein the single point of intersection substantially corresponds to a geometrical center of the sensor body.

22. The system according to claim 19, wherein the sensor electronics further comprises one or more of the following: amplifiers for amplifying measured voltages, a power source, and a communication unit for communicating the measured voltages to a receiver arranged remote from the sensor.

23. The system according to claim 19, wherein for each electrode pair an interconnecting line is formed interconnecting the first electrode and the second electrode, and wherein the electrodes are distributed over the surface such that the interconnecting lines intersect at the single point of intersection.

24. The system according to claim 19, wherein the bias electrode is arranged outside of the sensor body at a center location in front of the sensor body.

25. The system according to claim 19, wherein the sensor body comprises a plastic material and/or a composite material.

26. The system according to claim 19, wherein the sensor body is hollow and is provided with a plurality of holes in its outer surface.

27. A method for manufacturing an electric field gradient sensor, comprising the steps of:
providing sensor electronics and a bias electrode arranged for setting a bias voltage for the sensor electronics;
forming a sensor body around the sensor electronics, the sensor body having an outer surface, wherein the outer surface is submerged in a fluid; and
forming a plurality of electrodes distributed over the outer surface, each electrode having an electrode surface facing outward from the outer surface and being electrically connected to the sensor electronics;
wherein the plurality of electrodes are arranged such as to form a plurality of electrode pairs, each electrode pair comprising a first electrode and a second electrode located on opposite sides of the sensor body,
wherein for each electrode pair an imaginary interconnecting line is formed interconnecting the first electrode and the second electrode,
wherein the electrodes are distributed over the outer surface such that the interconnecting lines intersect at a single point of intersection within the sensor body, and
wherein each electrode is provided with a non-conductive tube, a first end of the tube enclosing the electrode, wherein the bias electrode is arranged at the single point of intersection.

28. The method according to claim 27, wherein the single point of intersection substantially corresponds to a geometrical center of the sensor body.

29. The method according to claim 27, wherein the sensor body is formed by 3D printing.

30. The method according to claim 27, wherein the sensor body is formed by molding or machining.

31. The method according to claim 27, wherein the sensor body comprises a plastic material or a composite material.

32. The method according to claim 27, wherein the step of forming the plurality of electrodes comprises providing electrodes having the outward facing electrode surface comprising gold, carbon, platinum, titanium or stainless steel.

33. The method according to claim 32, wherein the electrode surface is formed by plating gold or platinum onto a metal.

34. The method according to claim 27, wherein the step of forming the plurality of electrodes comprises plating circuit boards with gold.

35. The method according to claim 27, wherein the step of forming the plurality of electrodes comprises printing carbon onto gold plated circuit boards.

36. The method according to claim 27, further comprising attaching a non-conducting tube to each of the electrodes such that a first end of the tube encloses the electrode, the tube extending radially outwards from the sensor body.

37. A method of performing electric field gradient measurements of a structure located in an electrically conducting medium, comprising the steps of:

providing an electric field gradient sensor, the electronic field gradient sensor including:

a sensor body having an outer surface, wherein the outer surface is submerged in a fluid;

a plurality of electrodes distributed over the outer surface, each electrode having an electrode surface facing outward from the outer surface, wherein the plurality of electrodes are arranged forming a plurality of electrode pairs, each electrode pair comprising a first electrode and a second electrode located on opposite sides of the sensor body;

sensor electronics for measuring a voltage over each of the electrode pairs, the sensor electronics comprising electrical contacts to each of the plurality of electrodes; and a bias electrode arranged for setting a bias voltage for the sensor electronics, wherein for each electrode pair an imaginary interconnecting line is formed interconnecting the first electrode and the second electrode, and wherein the electrodes are distributed over the outer surface such that the interconnecting lines intersect at a single point of intersection within the sensor body, and wherein each electrode is provided with a non-conductive tube, a first end of the tube enclosing the electrode, wherein the bias electrode is arranged at the single point of intersection;

mounting the sensor to an unmanned underwater vehicle; and moving the vehicle along at least a part of the structure, while sampling differential voltages over the electrode pairs of the sensor at a plurality of sampling locations.

38. The method according to claim 37, wherein the sensor is maintained substantially fixed with respect to the vehicle.

39. The method according to claim 37, wherein the differential voltages are combined to form an electric field gradient vector at each of the plurality of sampling locations.

40. The method according to claim 37, further comprising registering a position of each sampling location.

* * * * *